United States Patent [19]

Takase

[11] 4,329,645
[45] May 11, 1982

[54] ROTATIONAL SPEED MEASURING SYSTEM HAVING A CIRCUIT FOR INCREASING THE ACCURACY THEREOF

[75] Inventor: Sadao Takase, Yokohama, Japan

[73] Assignee: Nissan Motor Company, Limited, Tokyo, Japan

[21] Appl. No.: 30,955

[22] Filed: Apr. 17, 1979

[30] Foreign Application Priority Data

Jun. 13, 1978 [JP] Japan ................................ 53-70312

[51] Int. Cl.$^3$ .......................... G01P 3/48; G01P 3/54; G01B 7/14
[52] U.S. Cl. ..................................... 324/166; 324/207
[58] Field of Search ............... 324/173, 174, 175, 207, 324/208, 391, 392, 166; 123/32 EB, 32 EC, 117 D, 117 R, 146.5 A

[56] References Cited

U.S. PATENT DOCUMENTS

| | | | |
|---|---|---|---|
| 3,525,044 | 8/1970 | Richmond | 235/92 FQ |
| 3,930,201 | 12/1975 | Ackermann et al. | |
| 3,955,178 | 5/1976 | Warfel | 235/92 TF |
| 3,963,987 | 6/1976 | Rivere | 324/166 |
| 4,024,458 | 5/1977 | Templin | 324/208 |
| 4,053,826 | 11/1977 | Wasawa et al. | 324/208 |
| 4,072,893 | 2/1978 | Huwyler | 324/208 |

FOREIGN PATENT DOCUMENTS 2836479 3/1979 Fed. Rep. of Germany .

Primary Examiner—Gerard R. Strecker
Assistant Examiner—Walter E. Snow
Attorney, Agent, or Firm—Lane, Aitken, Kice & Kananen

[57] ABSTRACT

A rotational speed measuring system comprises a rotatable member with calibration segments and a marker portion both provided along the periphery of the rotatable member, pick-ups for producing a pulse train signal in response to passage of the calibration segments and the marker portion when the rotatable member rotates, an electrical circuit for producing calibration pulses and marker pulses in response to the output signals of the pick-ups, a monostable multivibrator responsive to the marker pulse to produce a pulse signal of a predetermined pulse width, and a counter responsive to the calibration pulses for a period of time defined by the pulse width of the pulse signal from the monostable multivibrator. The counter counts the number of the calibration pulses corresponding to calibration segments which are equidistantly spaced from each other, thereby producing an output signal indicative of the rotational speed of the rotatable member with high accuracy.

7 Claims, 9 Drawing Figures

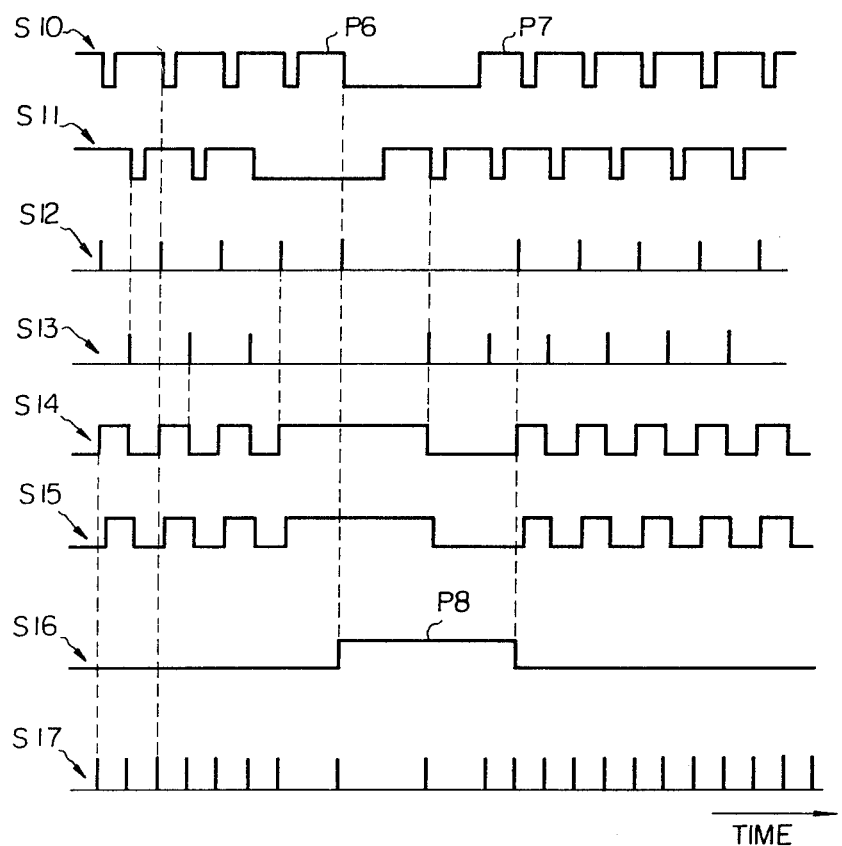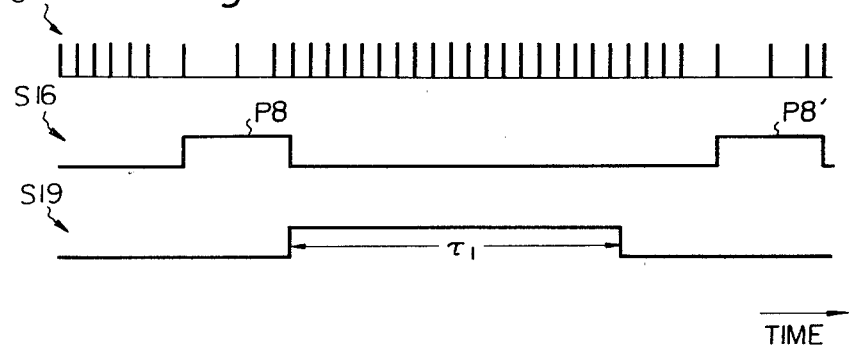

ROTATIONAL SPEED MEASURING SYSTEM HAVING A CIRCUIT FOR INCREASING THE ACCURACY THEREOF

FIELD OF THE INVENTION

This invention generally relates to an electronic rotational speed measuring system. More particularly, the present invention relates to such a system which is suitable for the measurement of the angular speed of the crankshaft of an internal combustion engine for a motor vehicle.

BACKGROUND OF THE INVENTION

An electronically controlled internal combustion engine which is equipped with various devices such as an electronic fuel injection system and/or an electronic ignition timing control system, requires a measuring apparatus which provides an electric signal indicative of the rotational information such as the rotational speed of the crankshaft of the engine or the advance angle of the ignition timing.

In one such apparatus a circular disk or body is fixedly connected to the crankshaft of an internal combustion engine so that the disk rotates in synchronization with the crankshaft. The circular disk has a plurality of gear teeth which have an equal circular pitch, along the peripheral surface of the disk. At least one marker, such as a projection, which is utilized for detecting the reference point or position of the circular disk, is mounted on the circular disk at a different position with respect to the gear teeth. Two pick-ups, which are of the electro-magnetic type, are respectively disposed on a fixed stationary member and are respectively arranged adjacent the peripheral surface and the circular track of the marker. These two pick-ups respectively emit a train of output impulse signals when the circular disk rotates since the magnetic resistance between the first pick-up and the gear teeth and the magnetic resistance between the second pick-up and the marker vary as the disk rotates. A first signal produced by the first pick-up provides calibration pulses via which angular measurement can be made while a second signal produced by the second pick-up is used to indicate a reference time or position which corresponds to the reference position from which an angle can be measured using the calibration pulses.

In case of utilizing such an apparatus, there are two methods for increasing the accuracy of the measurement of the advance angle. The first method is to increase the number of the teeth, i.e. the calibrating members, and the second method is to employ more than two pickups which are aligned in a direction of the rotation of the circular disk, for producing, via suitable circuitry, a signal indicative of the phase difference between the output signals thereof. In the former case, precision machining for producing the large number of gear teeth is required and thus the first method is not suited to mass-production. In the latter case, at least three pick-ups are necessary, viz. two for the teeth and one for the marker. The increase of the number of pick-ups causes a cost increase since each pick-up is relatively expensive. Moreover, if more than two pick-ups are disposed adjacent the peripheral surface of the disk, it is necessary to arrange these two pick-ups within a circular pitch of the teeth. Furthermore, an adjustment of the space or gap between the pick-ups and the peripheral surface of the disk is troublesome and time consuming.

In another type of an apparatus for measuring the advance angle, only one pick up is employed for sensing both of the gear teeth and the marker. In this type of apparatus, the marker is disposed between two specific teeth, so that the single pick-up, which is arranged adjacent the peripheral surface of the circular disk, produces a train of pulse signals as the disk rotates. In order to distinguish a signal indicative of the reference position or angle from the other calibration pulse signals, the circular pitch between the two specific teeth is different from those of the other teeth which are equidistantly spaced or angularly displaced whereby the phases of the two signals are different from each other. Consequently, the output signal of the pick-up will be divided, by means of the phase difference, into two signals which respectively indicate the reference position and the calibration signals.

Apart from the above described conventional apparatus, some technicians of Nissan Motor Company Limited have proposed a new apparatus for measuring rotational angle of a rotary member in a Japanese Patent Application No. (52-103399). According to the new apparatus, the calibration gear teeth and a marker are aligned on the same periphery of a rotary disk so that a single pick-up produces both of calibration pulses and a marker pulse per revolution of the rotary disk. The marker is actually a teeth-omitted portion, i.e. the calibration gear teeth are equidistantly arranged along the periphery of the disk except the marker portion. In other words, the circular pitch of teeth adjacent to the marker portion is different from other pitches of the calibration gear teeth. In the above mentioned apparatus, if it is desired to increase the accuracy of measurement, the number of the pick-ups may be increased.

Although the apparatus for measuring rotational angle of a rotary member measures the rotational angle such as an advance angle of ignition timing, correctly, when it is intended to use the same disk and pick-up(s) for the measurement of the rotational speed of the rotary member, the rotational speed is erroneously detected due to the marker, i.e. the teeth-omitted portion. Since the basic idea of measurement of the rotational speed is to count the number of pulses produced in response to the passage of the gear teeth which are equidistantly arranged, for a predetermined period of time, if some of the gear teeth have different circular pitch with respect to other gear teeth, the number of the pulses counted per unit time does not correctly indicate the actual rotational speed.

It will be understood that it would be convenient if the same parts such as the rotary disk, pick-up(s) and a portion of an electrical circuit are used for both of a rotational angle measuring system and a rotational speed measuring system. However, as described hereinabove, when some of the gear teeth are not equidistantly arranged, the pulse number per unit time does not indicate the actual rotational speed.

SUMMARY OF THE INVENTION

The present invention has been achieved in order to remove the above mentioned disadvantages that a rotary disk having calibration segments such as gear teeth with irregular pitch provides an erroneous rotational speed.

It is, therefore, an object of the present invention to provide a rotational speed measuring system including a rotary disk which is also used for the measurement of the rotational angle of a rotational member.

Another object of the present invention is to provide such a rotational speed measuring system in which a rotary disk having includes calibration segments with an irregular pitch portion.

A further object of the present invention is to provide a rotational speed measuring system which accurately detects the rotational speed of a rotary member.

According to the present invention, the number of calibration segments, such as gear teeth, is counted in a manner that only the pulses corresponding to the equidistantly spaced segments are counted by eliminating pulses corresponding to the marker portion, i.e. the teeth-omitted portion, in some embodiments. In one embodiment, the number of pulses corresponding to both of the equidistantly spaced segments and the marker portion are counted and the counted number is corrected by a correction signal indicative of the number of pulses corresponding to the marker portion.

BRIEF DESCRIPTION OF THE DRAWINGS

These and other objects and features of the present invention will become more readily apparent from the following detailed description of the preferred embodiments taken in conjunction with the accompanying drawings in which:

FIG. 4 shows a time chart of various signals produced in the first portion of the electrical circuitry shown in FIG. 3;

FIG. 5 shows a time chart of various signals produced in the second portion of the electrical circuitry shown in FIG. 3;

DETAILED DESCRIPTION OF THE PREFERRED EMBODIMENTS

Figure 1:
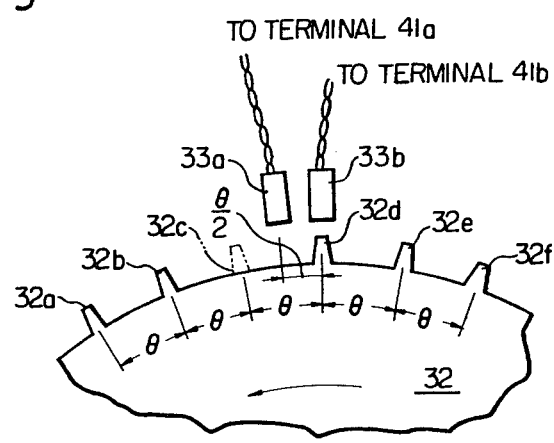
FIG. 1 shows a partial view of a rotary disk having gear teeth, used in the embodiments of the rotational speed measuring system according to the present invention.

Referring to FIG. 1, a disk 32 which is used in the preferred embodiments of the rotational speed measuring system according to the present invention is shown. Although a partial view of the disk 32 is shown, the axle of the disk is fixedly connected to a rotatable shaft, such as the crankshaft of the engine (not shown), to rotate in synchronization with the engine shaft. The disk 32 has a plurality of gear teeth 32a, 32b, 32d, 32e and 32f which are provided along the periphery of the disk 32.

These teeth except for one are arranged along the peripheral surface of the disk 32 with a predetermined circular pitch or space expressed in terms of $\theta$. As shown by a dotted line, a tooth 32c is omitted so that the distance between two adjacent teeth 32b and 32d including the portion 32c is twice that of the other distances between teeth such as teeth 32a and 32b. The rotatable disk 32 is arranged by way of example to rotate counterclockwise as indicated by a directed line.

First and second electro-magnetic pick-ups 33a and 33b are stationarily disposed adjacent to the peripheral surface of the disk 32. The first and second pick-ups 33a and 33b are aligned radially with respect to the rotatable disk 32 and angularly displaced by $\theta/2$. With this provision the output signals of the first and second pick-ups 33a and 33b have a phase difference of a half pitch of the circular pitch $\theta$ with respect to each other. The output signals will be fed to circuitry in which a reference time or position signal, which will be referred to as a marker signal hereinafter, and a calibration signal are respectively produced.

Figure 2:
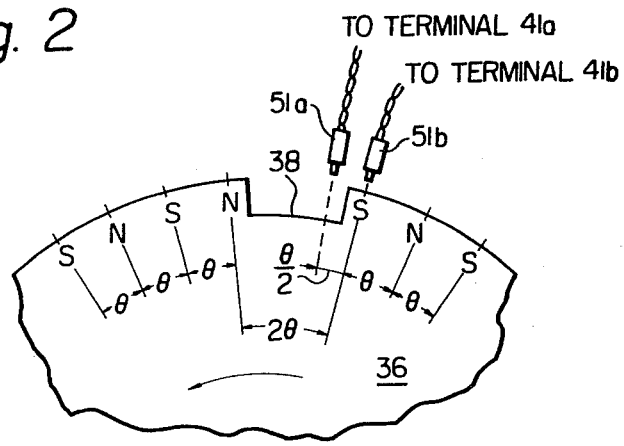
FIG. 2 shows a partial view of a second rotary disk having magnetized portions, used in the embodiments of the rotational speed measuring system according to the present invention.

FIG. 2 illustrates a partial view of a magnetized circular disk 36 and a pair of magneto-sensitive pick-ups 51a and 51b which are utilized in place of the arrangement shown in FIG. 1. The arrangement shown in FIG. 2 is the same as that shown in FIG. 1 except that the plurality of gear teeth 32a to 32f and the electromagnetic pick-ups 33a and 33b are respectively replaced by a plurality of magnetized portions N and S and magneto-sensitive pick-ups 51a and 51b. The disk 36 has a recess 38 between specific magnetized portions N and S which are angularly displaced by an angle $2\theta$ where other magnetized portions N and S are equidistantly separated by an angle $\theta$. The recess 38 is made for providing an unmagnetized portion which corresponds to the tooth-omitted portion 32c of the disk 32 shown in FIG. 1. If desired, instead of providing such a recess 38 for the rotatable disk 36, it is possible to obtain the same effect by not magnetizing the portion which corresponds to the recess 38. It is also possible to obtain the same effect by reducing the magnitude of the magnetization of the portion corresponding to the recess 38 without providing such a recess 38. The output signals of the pick-ups 51a and 51b will be fed to circuitry in which a reference time or position marker signal and a calibration signal are respectively produced.

Figure 3:
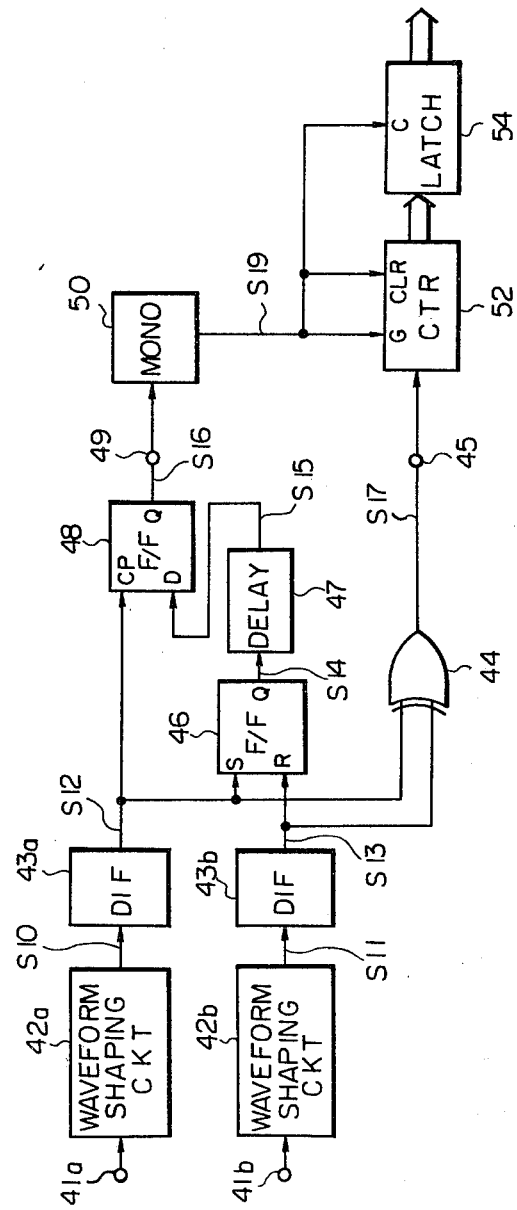
FIG. 3 shows in schematic block diagram a first embodiment of the electrical circuitry used in the rotational speed measuring system according to the present invention.

Hence, reference is now made to FIG. 3 which shows the above mentioned circuitry utilized in a first preferred embodiment of the rotational speed measurement system according to the present invention. The circuitry shown in FIG. 3 may be connected to either the pair of pick-ups 33a and 33b or 51a and 51b respectively shown in FIG. 1 and FIG. 2. The circuitry consists of first and second portions. The first portion of the circuitry is defined between two input terminals 41a and 41b and two junctions 49 and 45, while the second portion includes remaining circuits which follow the junctions 49 and 45.

The first portion of the circuitry shown in FIG. 3 corresponds with one of the circuits described in the above mentioned Japanese Patent Application No. (52-103399) and includes first and second input terminals 41a and 41b which are respectively connected to the outputs of the pick-ups 33a and 33b. The first input terminal 41a is connected to an input of a first waveform shaping circuit 42a while the second input terminal 41b is connected to an input of a second waveform shaping circuit 42b. The outputs of each pulse waveform shaping circuit 42a and 42b are respectively connected to inputs of first and second differentiation circuits 43a and 43b. The output of the first differentiation circuit 43a is connected to a clock pulse input CP of a D type flip-flop 48, to a set terminal S of a flip-flop 46 and to a first input of an EX (exclusive) OR gate 44. The output of the second differentiation circuit 43b is connected to a reset terminal R of the flip-flop 46 and to a second input of the EX-OR gate 44 the output of which is connected to the second junction 45. An output Q of the flip-flop 46 is connected to an input of a delay circuit 47 the output of which is connected to a data input D of the D type flip-flop 48. The output of the D type flip-flop 48 is connected to the first junction 49.

The second portion of the circuitry shown in FIG. 3 includes a monostable multivibrator 50, a counter 52 and a latch 54. The monostable multivibrator 50 has an input connected via the first junction 49 to the output of the D-type flip-flop 48. The counter 52 has an input connected via the second junction 45 to the output of the EX-OR gate 44. The output of the monostable multivibrator 50 is connected to a gate terminal G and a clear terminal CLR of the counter 52 and to a control terminal C of the latch 54. The output of the counter 52 is connected to an input of the latch 54. The wide directed line between the counter 52 and the latch 54 and the other wide directed line extending from the output of the latch 54 indicate that a plurality of conductors or wires are actually provided for the transmission of a binary coded signal.

The function and operation of the first portion of the circuitry shown in FIG. 3 will be made hereinafter taken in conjunction with signal waveforms (time chart) shown in FIG. 4. The first and second waveform shaping circuits 42a and 42b, such as schmitt trigger circuits or comparators, respectively generate a train of logic level pulse signals S10 and S11, in response to the output signals derived from the first and second pick-ups 33a and 33b. The first and second differentiation circuits 43a and 43b respectively produce first and second trains of impulses S12 and S13 in response to the trailing edges of the pulses of signals S10 and S11. Since the flip-flop 46 is set and reset by the first and second impulses S12 and S13, an output pulse signal S14 is obtained at the output A thereof. This output signal S14 is delayed by the delay circuit 47 and then a delayed signal S15 is applied to the data input D of the D type flip-flop 48. The D type flip-flop 48 generates an output signal S16 having a pulse P8 the leading edge of which is determined by a pulse of the signal S12 occurring first in the duration that the signal S15 assumes a high level, and the trailing edge of the pulse P8 is determined by a pulse of the signal S12 occurring first in the duration that the signal S15 assumes a low level.

On the other hand, the EX-OR gate 44 produces an output pulse signal S17 when the levels of the input signals S12 and S13 are different from each other. Consequently, the signals S16 and S17 are respectively obtained at the first and second junctions 49 and 45. The leading edge of the pulse P8 of the signal S16 is defined by the trailing edge of a pulse P6 which is generated by the first pick-up 33a in response to the passage of the tooth 32b, while the trailing edge of the pulse P8 is defined by the trailing edge of the pulse P7 which is generated by the first pick-up 33a in response to the passage of the tooth 32d. This pulse P8 of the signal S16 can be utilized for indicating a reference position, angle or time when a predetermined part of the pulse P8 corresponds to the top dead center of a piston movement in a cylinder of an internal combustion engine. Since the signal S17 corresponds to both of the signals S12 and S13, the number of pulses which are utilized as calibrations for measuring the rotational angle, is doubled compared to the number of the pulses of each differentiated signals S12 and S13. These two signals S16 and S17 developed at the junctions 49 and 45 will be respectively referred to as a marker signal and a calibration signal hereinafter throughout the specification. Although the arrangements shown in FIGS. 1 and 2 include two pick-ups, the number of pick-ups is not necessarily more than two. In other words, a single pick-up may produce an output signal including two pieces of information, i.e. the calibration signal and the marker signal. These two pieces of information may be divided into two different signals by a suitable electrical circuit by way of the phase difference between two pieces of information. Further, although the illustrated embodiments show a marker portion as a teeth-omitted portion or a recess, the marker portion may be obtained by providing extra segments (gear teeth or magnetized portions) so that density of the segments in the marker portion is higher than that of the calibration segments.

When the first portion of the circuitry shown in FIG. 3 is utilized for the measurement of the rotational angle of a rotary member for the detection of an advanced angle of ignition timing, the two signals S16 and S17 are fed to a circuit in which the number of the pulses included in the calibration signal S17 between a reference time which may correspond to an instant at which an ignition pulse is produced, and an instant defined by the leading edge of the pulse P8 included in the marker signal S16 is counted.

The operation of the second portion shown in FIG. 3 will be described hereinafter taken in conjunction with another time chart shown in FIG. 5. It will be seen that the marker signal S16 and the calibration signal S17 which are shown in FIG. 4 are also shown in FIG. 5 on a reduced scale of the time axis.

In response to the trailing edge of the pulse P8 included in the marker signal S16, the monostable multivibrator 50 is triggered to produce a pulse signal S19 the pulse width $\tau_1$ of which is predetermined. The pulse width $\tau_1$ is selected by the time constant of the monostable multivibrator 50 to be less than the duration between two consecutive pulses P8 and P8' which may occur under the highest possible rotational speed of the disk 32 or 36. The output pulse S19 is fed to the gate terminal G of the counter 52 to enable the counter 52. In other words, the counter 52 counts the number of pulses included in the calibration signal S17 only for the period of time defined by the pulse width $\tau_1$ of the pulse signal S19 from the monostable multivibrator 50. The pulse signal S19 will be referred to as a gate signal. As shown in FIG. 5, only the pulse corresponding to the euiqdistantly spaced teeth 32d, 32e, 32f . . . are fed to the counter 52, while the pulses corresponding to the marker portion 32c are not fed to the same. In other words, during the presence of the gate signal S19 the calibration signal S17 does not contain pulses corresponding to the teeth-omitted portion. Since the counter 52 counts the number of calibration pulses S17 during the presence of the gate signal S19, the pulses corresponding to the equidistantly spaced teeth are counted, while the pulses corresponding to the teeth-omitted portion, i.e. the marker portion, are not counted. Namely, the output signal of the counter 52 indicates the rotational speed of the disk 32 or 36 correctly. The output signal, which is actually a binary coded signal, of the counter 52 is transmitted to the latch 54 in response to the trailing edge of the gate signal S19 applied to the control terminal C of the latch 54. The gate signal S19 is applied to the clear terminal CLR of the counter so that the datum developed in the counter 52 is cleared (cancelled) in response to the trailing edge of the gate signal S19. The clearance of the datum is, however, performed each time after the datum is transferred to the latch 54 because of a time delay caused by elements in the counter 52. If necessary, a suitable delay circuit may be interposed between the output of the monostable multivibrator 50 and the clear terminal CLR of the counter 52 to ensure a time delay to the counter 52. Since the datum stored in the counter 52 is cleared at the end of the period of time, the counter 52 counts the number of calibration pulses S17 again from zero when the counter is enabled in response to the next gate signal S19. In this manner the counter 52 counts the number of the calibration pulses S17 each time the gate signal S19 is applied to the gate terminal G to transmit the datum to the latch 54 repeatedly. The datum stored in the latch 54 is, therefore, refreshed each time a new datum is transferred from the counter 52 in response to the trailing edge of the gate signal S19. The datum stored in the latch 54 will be used in an electronic circuit such as a pulse generating circuit included in a fuel injection system.

If a single marker portion, i.e. the teeth-omitted portion 32c, is provided along the periphery of the disk 32, the datum stored in the latch 54 is refreshed at every revolution of the disk 32. Therefore, the arrangement of the first embodiment shown in FIG. 3 is advantageous for detecting the rotational speed with high accuracy especially when the variation in rotational speed is relatively large. Of course when more than two marker portions 32c are provided along the periphery of the disk 32, the measurement of the rotational speed is performed as many times as the number of the marker portions 32c, and thus the accuracy of the measurement is further higher.

Figure 6:
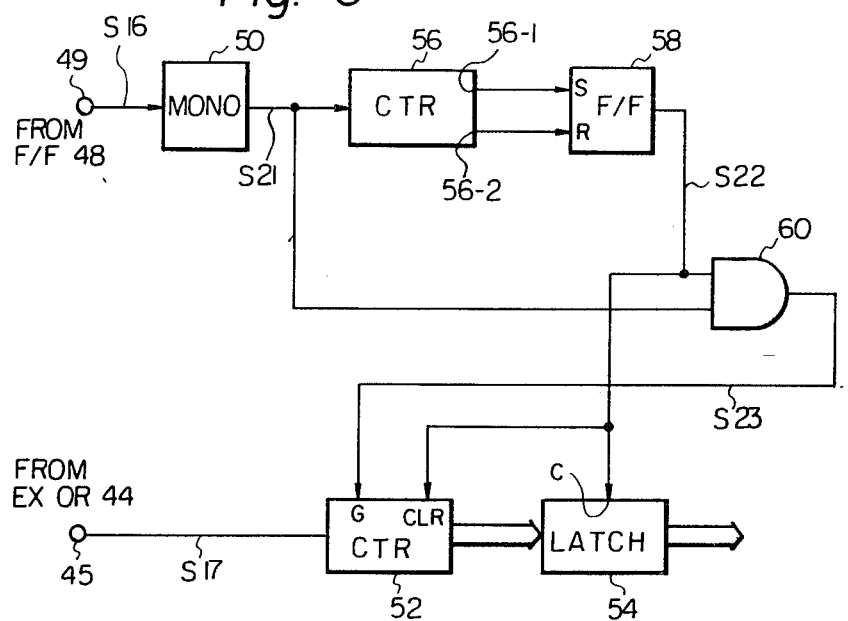
FIG. 6 shows in schematic block diagram a second embodiment of the electrical circuitry used in the rotational speed measuring system according to the present invention.

Reference is now made to FIG. 6 which shows a block diagram of the second embodiment of the second portion of the circuitry of the rotational speed measuring system according to the present invention. The second portion shown in FIG. 6 has first and second junctions 49 and 45 for connection with the first portion shown in FIG. 3. The same circuits with respect to the first embodiment are designated by like numerals.

The second portion shown in FIG. 6 includes a monostable multivibrator 50, a first counter 52, a second counter 56, a flip-flop 58, an AND gate 60 and a latch 54. The first junction 49 is connected to an input of the monostable multivibrator 50 the output of which is connected to an input of the second counter 56 and to a second input of the AND gate 60. The second counter 56 has first and second outputs 56-1 and 56-2 respectively connected to the set terminal S and the reset terminal R of the flip-flop 58. The output of the flip-flop 58 is connected to a first input of the AND gate 60, to a clear terminal CLR of the first counter 52, and to a control terminal C of the latch 54.

The second junction 45 is connected to an input of the first counter 52 which has a gate terminal G connected to the output of the AND gate 60. The output of the first counter 52 is connected to an input of the latch 54.

Figure 7:
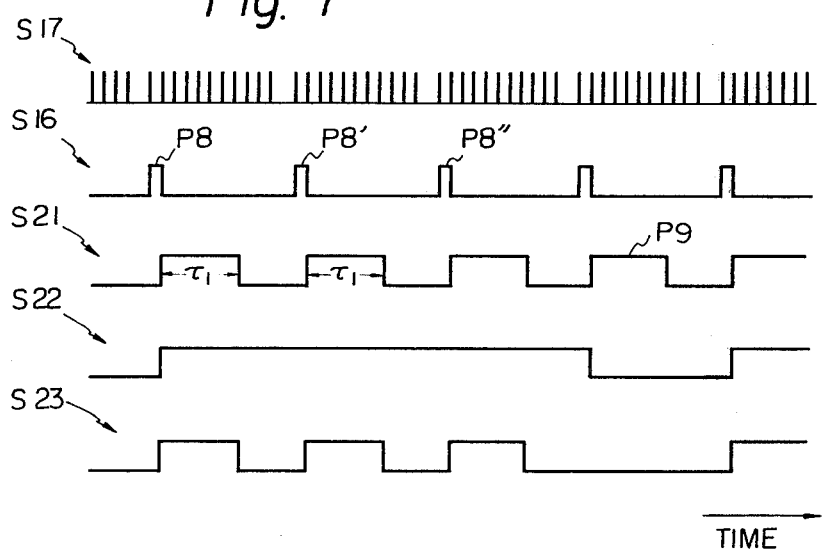
FIG. 7 shows a time chart of various signals produced in the electrical circuitry shown in FIG. 6.

The monostable multivibrator 50 functions in the same manner as in the first embodiment to produce a pulse signal S21, width of which is $\tau_1$, each time a marker pulse P8 included in the signal S16 is applied thereto to trigger the same. The second counter 56 counts the number of pulses S21 to produce two output signals. Namely, the second counter 56 produces a first signal in response to the leading edge of a first pulse P8 included in the marker signal S16 and a second signal when the number of the marker pulses S16 (P8, P8', P8" . . . ) equals a predetermined value, such as three. The first signal is referred to as a set signal and is applied to the set terminal S of the flip-flop 58 to set the same, while the second signal is referred to as a reset signal and is fed to the reset terminal R of the flip-flop 58 to reset the same. When the flip-flop 58 is set, the flip-flop 58 produces an output pulse signal S22 of a high level as shown in FIG. 7. The flip-flop 58 is reset to produce a low level signal in response to a leading edge of the fourth pulse P9 of the output pulse train signal S21. Since the output pulses S21 from the monostable multivibrator 50 and the output pulse S22 from the flip-flop 58 are respectively applied to the AND gate 60, the AND gate 60 transmits a predetermined number of pulses S21 during the presence of the pulse S22. The output signal S23 of the AND gate 60 is used as a gate signal in the first counter 52. The first counter 52 which is responsive to the calibration pulses S17 is thus controlled to permit the transmission of the calibration pulses S17 only when the gate signal S23 is applied to the first counter 52.

With this provision, the first counter 52 counts the number of the calibration pulses S17 cumulatively. Since the gate pulses S23 are applied to the first counter 52 three times during one cycle of the pulse signal S22 from the flip-flop 58, the output signal of the first counter 52 indicates the sum of the numbers of the calibration pulses S17 respectively applied to the first counter 52 each time the gate signal S23 is fed to the gate terminal G of the first counter 52. The output signal of the first counter 52 is transferred to the latch 54 to be stored therein. The latch 54 is responsive to the trailing edge of the pulse signal S22 from the flip-flop 58 to latch the input datum derived from the first counter 52. The datum stored in the first counter 52 is cleared after the datum is transferred to the latch 54, in response to the trailing edge of the pulse S22 in the same manner as in the first embodiment. Therefore, the datum stored in the latch 54 is refreshed each time the flip-flop 58 is reset. The datum stored in the latch 54 will be used in a following electronic circuit in the same manner as in the first embodiment.

It will be understood that the second embodiment is advantageous for the increase of the accuracy of the measurement of a rotational speed when the variation in rotational speed is relatively small, since the substantial length of time for the measurement is longer than that in the first embodiment, where the measuring time in the second embodiment is $3\tau_1$. In the second embodiment, as described and shown in FIGS. 6 and 7, the number of times for the cummulative measurement corresponds to $3\tau$. However, if desired, the number of pulses S23 may be further increased by extending the width of the pulse S22 to count the number of the calibration pulses S17 for a longer period of time.

Figure 8:
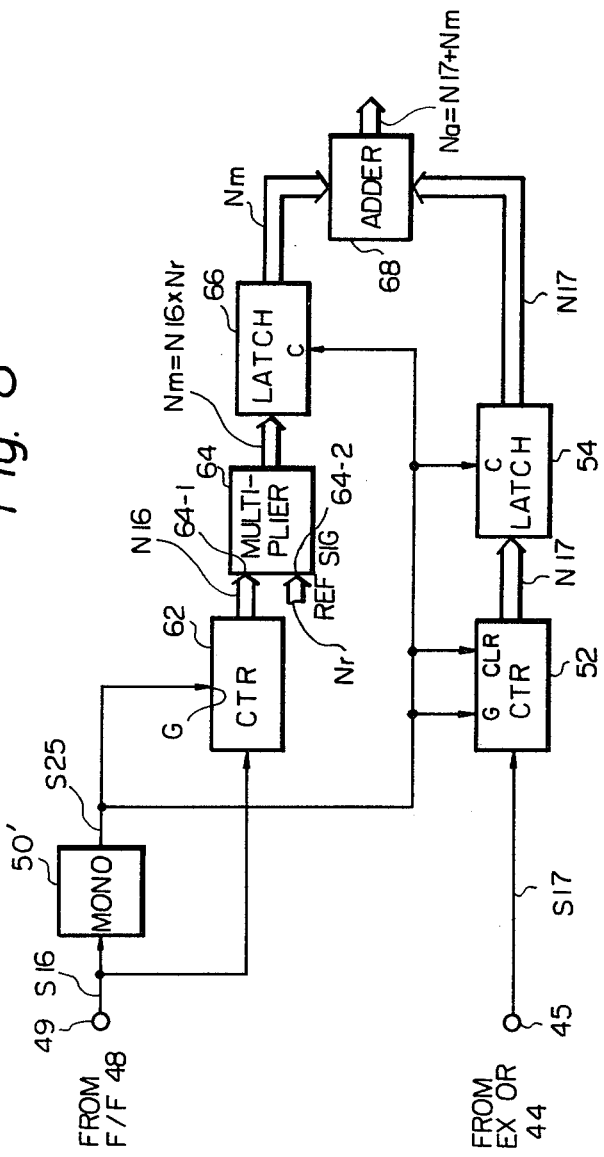
FIG. 8 shows in schematic block diagram a third embodiment of the electrical circuitry used in the rotational speed measuring system according to the present invention.

FIG. 8 illustrates a block diagram of a third embodiment of the second portion of the circuitry of the rotational speed measuring system according to the present invention. The second portion shown in FIG. 8 is connected via the first and second junctions 49 and 45 to the first portion shown in FIG. 3 in the same manner as in the previously described first and second embodiments. The same circuits as in the first embodiment are designated by the like reference numerals. The second portion shown in FIG. 8 includes a monostable multivibrator 50', first and second counters 52 and 62, a multiplier 64, first and second latches 54 and 66, and an adder 68.

The first junction 49 is connected to an input of the monostable multivibrator 50' and to an input of the second counter 62. The output of the monostable multivibrator 50' is connected to gate terminals G of the first and second counters 52 and 62, to a clear terminal CLR of the first counter 52, and to a control terminal of the first latch 54. The second junction 45 is connected to an input of the first counter 52. The output of the first counter 52 is connected to an input of the first latch 54 the output of which is connected to a first input of the adder 68. The output of the second counter 62 is connected to a first input 64-1 of the multiplier 64 which has a second input 64-2 for receiving a reference signal. The output of the multiplier 64 is connected to an input of the second latch 66 the output of which is connected to a second input of the adder 68. The wide directed lines in FIG. 8 indicate a plurality of wires for the transmission of binary coded signals. The adder 68 has an output to emit an output signal therefrom.

Figure 9:
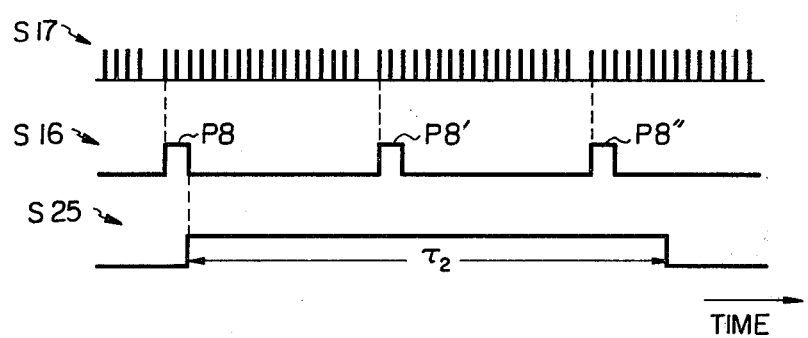
FIG. 9 shows a time chart of various signals produced in the electrical circuitry shown in FIG. 8.

The third embodiment shown in FIG. 8 operates as follows. The operation will be described in connection with the time chart shown in FIG. 9. In the same manner as in the first and second embodiments, the marker pulse signal S16 is applied to the input of the monostable multivibrator 50', while the calibration pulse signal S17 is fed to the input of the second counter 52. The time constant of the monostable multivibrator 50' is, however, set in a different manner with respect to the above described first and second embodiments. As shown in FIG. 9, the monostable multivibrator 50' produces a pulse signal S25 in response to the trailing edge of the marker pulse signal S16, where the pulse width $\tau_2$ of the output pulse signal S25 is set to be longer than the duration between two consecutive marker pulses P8 and P8'. In this illustrated embodiment, the pulse width $\tau_2$ is set a little longer than two times the duration between two consecutive marker pulses P8 and P8'. The output pulse S25 of the monostable multivibrator 50' is fed to the gate terminals G of the first and second counters 52 and 62 as gate signals to enable them.

The first counter 52 counts the number of the calibration pulses S17, while the second counter 62 counts the number of marker pulses S16, for a predetermined period of time defined by the pulse width $\tau_2$ of the gate signal S25. At the end of the gate signal S25 the first counter 52 produces an output signal indicative of the number of a plurality of calibration pulses S17, while the second counter 62 produces an output signal indicative of the number of marker pulses P8' and P8". The output signal of the first counter 52, therefore, includes information corresponding to not only the equidistantly spaced gear teeth but also the marker portion, i.e. the teeth-omitted portion such as 32c shown in FIG. 1. In other words, the number of the calibration pulses indicated by the first counter 52 output signal erroneously indicates the rotational speed of the rotary disk 32 due to the irregular arrangement of the calibration pulses S17. The erroneous signal from the first counter 52 is fed to the first latch 54 to be stored therein. The datum stored in the first latch 54 is transmitted to the first input of the adder 68 to be compensated for in the following manner.

The output signal of the second counter 62, which signal is an indication of a number N16 of the marker pulses P8' and P8", is fed to the first input 64-1 of the multiplier 64 to be multiplied by a predetermined number Nr corresponding to the number of teeth omitted from each marker portion. In the illustrated embodiment the number Nr of the omitted teeth is one as shown in FIG. 1. A reference signal which indicates the predetermined number Nr, such as one, is applied to the second input 64-2 of the multiplier 64 so that the number N16 of the marker pulses P8' and P8" is multiplied by the predetermined number Nr. The output signal of the multiplier 64, indicative of a number (Nm=N16×Nr), is fed via the second latch 66 to the second input of the adder 68, in which the two numbers N17 and Nm are added to each other. The output signal of the adder 68 thus indicates the sum of these two numbers N17 and Nm. The number Na indidicated by the adder 68 output signal is expressed by Na=N17+Nm.

If the gear teeth 32a, 32b, 32d, 32e . . . are arranged on the periphery of the disk 32 equidistantly by one degree, viz., $\theta$ is 1°, except the marker portion 32c, the number of the gear teeth is 359. It is assumed, for explanation, that the number N17 of the calibration pulses S17 counted by the first counter 52 is 800, while the number N16 of the marker pulses P8' and P8" is 2. The number Nr indicated by the reference signal is 1, since the number of the gear teeth 32c omitted from the periphery of the disk 32 is 1. Under this condition, the number Nm indicated by the output signal of the multiplier 64 is 2 since Nm=N16×Nr=2×1. Accordingly, the number Na indicated by the output signal of the adder 68 will be expressed by Na=N17+Nm=800+2=802. From the foregoing, it will be understood that the output signal of the multiplier 64 is used as a compensation or correction signal to modify the number N17 indicated by the output signal of the first counter 52. Therefore, the erronous number N17 is corrected to indicate the actual rotational speed of the disk 32. If desired, the duration for which the first counter 52 is enabled to count the number of the calibration pulses S17 may be increased to obtain higher accuracy of the measurement.

Although it is described hereinabove that the marker portion 32c is a teeth-omitted portion, a reverse arragement, i.e. a teeth-added portion may be possible. Namely at least one extra tooth may be disposed between two consecutive calibration teeth, where all of the calibration teeth are equidistantly arranged on the periphery of a rotary disk. In this case, the adder 68 shown in FIG. 8 is substituted with a subtractor to subtract the number of calibration pulses corresponding to the extra teeth from the counted number of the calibration pulses in order to obtain the actual rotational speed.

It will be understood for those skilled in the art that many modifications and variations are possible without departing from the spirit of the instant invention.

What is claimed is:

1. A rotational speed measuring system, comprising:
   (a) a rotational member;

(b) sensor means fixedly disposed adjacent to the peripheral portion of said rotatable member;

(c) first means arranged on said peripheral portion of said rotatable member for causing said sensor means to generate a calibration pulse train signal when said rotatable member rotates;

(d) marker means arranged on said peripheral portion of said rotatable member for causing said sensor means to produce a marker pulse signal when said rotatable member rotates;

(e) an electric circuit connected to said sensor means for distinguishing said calibration pulse train signal produced in response to passage of said first means from said marker pulse signal produced in response to passage of said marker means;

(f) a monostable multivibrator responsive to said marker pulse signal to produce a pulse signal of a predetermined pulse width;

(g) a first counter responsive to said calibration pulse train signal and to said pulse signal from said monostable multivibrator for counting the number of said calibration pulses for said predetermined period of time;

(h) a second counter responsive to said marker pulse signal for producing an output signal indicative of the number of the marker pulses;

(i) a multiplier responsive to the output of said second counter for producing a signal indicative of a number which corresponds to the product of said number of said marker pulses and a predetermined number; and (j) an adder responsive to the output signal of said first counter and said multiplier for producing a signal indicative of a number corresponding to the sum of the number of the calibration pulses indicated by said first counter output signal and the number corresponding to said product.

2. A system as claimed in claim 1, further comprising: a latch responsive to the output signal of said multiplier.

3. A rotational speed measuring system, comprising:
(a) a rotational member;
(b) sensor means fixedly disposed adjacent to the peripheral portion of said rotatable member, said sensor means comprising first and second pick-ups angularly disposed with respect to said rotational member;
(c) first means arranged in said peripheral portion of said rotatable member for causing said sensor means to generate a calibration pulse train signal when said rotatable member rotates, said first means comprising a plurality of magnetized portions aligned along the peripheral portion of said rotatable member, the circular pitches of said magnetized portions being equal except in a portion where said marker means is arranged, said first and second pick-ups being spaced from each other as much as half pitch of the circular pitch of said magnetized portions;
(d) marker means arranged on said peripheral portion of said rotatable member for causing said sensor means to produce a marker pulse signal when said rotatable member rotates;
(e) an electric circuit connected to said sensor means for distinguishing said calibration pulse train signal produced in response to passage of said first means from said marker pulse signal produced in response to passage of said marker means, said electric circuit comprising:

(i) first and second waveform shaping means for respectively producing first and second trains of pulses of a logic level in response to the output signals of said first and second pick-ups;
(ii) first and second differentiation circuits respectively connected to said first and second waveform shaping means for producing first and second differentiated signals in response to the trailing edges of the pulses of said first and second trains of pulses;
(iii) a first bi-stable circuit connected to said first and second differentiation circuits for producing an output pulse signal, the leading edge and the trailing edge of which are defined by said first and second differentiated signals;
(iv) a delay circuit connected to the output of said first bi-stable circuit for producing a delayed signal of the bi-stable circuit output signal;
(v) a second bi-stable circuit, a clock input and a data input of which are respectively connected to said first differentiation circuit and to said delay circuit; and
(vi) a logic gate connected to said first and second differentiation circuits for transmitting said first and second differentiated signals.

4. A rotational speed measuring system, comprising:
(a) a rotational member;
(b) sensor means fixedly disposed adjacent to the peripheral portion of said rotatable member, said sensor means comprising first and second pick-ups angularly disposed with respect to said rotational member;
(c) first means arranged on said peripheral portion of said rotatable member for causing said sensor means to generate a calibration pulse train signal when said rotatable member rotates, said first means comprising a plurality of gear teeth aligned along the peripheral portion of said rotatable member, the circular pitches of said gear teeth being equal to each other except in a portion where said marker means is arranged, said first and second pick-ups being spaced from each other as much as half pitch of the circular pitch of said gear teeth;
(d) marker means arranged on said peripheral portion of said rotatable member for causing said sensor means to produce a marker pulse signal when said rotatable member rotates;
(e) an electric circuit connected to said sensor means for distinguishing said calibration pulse train signal produced in response to passage of said first means from said marker pulse signal produced in response to passage of said marker means, said electric circuit comprising:

(i) first and second waveform shaping means for respectively producing first and second trains of pulses of a logic level in response to the output signals of said first and second pick-ups;
(ii) first and second differentiation circuits respectively connected to said first and second waveform shaping means for producing first and second differentiated signals in response to the trailing edges of the pulses of said first and second trains of pulses;
(iii) a first bi-stable circuit connected to said first and second differentiation circuits for producing an output pulse signal, the leading edge and the trailing edge of which are defined by said first and second differentiated signals;

(iv) a delay circuit connected to the output of said first bi-stable circuit for producing a delayed signal of the bi-stable circuit output signal;

(v) a second bi-stable circuit, a clock input and a data input of which are respectively connected to said first differentiated circuit and to said delay circuit; and (vi) a logic gate connected to said first and second differentiation circuits for transmitting said first and second differentiated signals.

5. A system as claimed in claim 3 wherein said marker means comprises a recess provided on the peripheral portion of said rotatable member between two consecutive magnetized portions, the circular pitch of two magnetized portions adjacent to said recess being greater than the circular pitch of said magnetized portions.

6. A system as claimed in claim 4, wherein said marker means comprises a portion at which gear teeth are omitted, the circular pitch of two gear teeth adjacent to said portion being greater than the circular pitch of the remaining gear teeth.

7. A rotational speed measuring system, comprising:
(a) a rotational member;
(b) sensor means fixedly disposed adjacent to the peripheral portion of said rotatable member;
(c) first means arranged on said peripheral portion of said rotatable member for causing said sensor means to generate a calibration pulse train signal when said rotatable member rotates;
(d) marker means arranged on said peripheral portion of said rotatable member for causing said sensor means to produce a marker pulse signal when said rotatable member rotates;
(e) an electric circuit connected to said sensor means for distinguishing said calibration pulse train signal produced in response to passage of said first means from said marker pulse signal produced in response to passage of said marker means;
(f) a monostable multivibrator responsive to said marker pulse signal to produce a pulse signal of a predetermined pulse width;
(g) a first counter responsive to said calibration pulse train signal and to said pulse signal from said monostable multivibrator for counting the number of said calibration pulses for said predetermined period of time;
(h) a second counter responsive to said marker pulse signal for producing an output signal indicative of the number of the marker pulses;
(i) a multiplier responsive to the output of said second counter for producing a signal indicative of a number which corresponds to the product of said number of said marker pulses and a predetermined number;
(j) a latch responsive to the output signal of said multiplier;
(k) an adder responsive to the output signal of said first counter and said latch for producing a signal indicative of a number corresponding to the sum of the number of the calibration pulses indicated by said first counter output signal and the number corresponding to said product.

* * * * *

UNITED STATES PATENT AND TRADEMARK OFFICE
CERTIFICATE OF CORRECTION

PATENT NO. : 4,329,645
DATED : May 11, 1982
INVENTOR(S) : Sadao Takase

It is certified that error appears in the above-identified patent and that said Letters Patent is hereby corrected as shown below:

ON THE TITLE PAGE, address of the assignee, should read

-- Yokohama City, Japan --.

Signed and Sealed this

Twenty-first Day of December 1982

[SEAL]

Attest:

GERALD J. MOSSINGHOFF

Attesting Officer        Commissioner of Patents and Trademarks